(12) United States Patent
Lei et al.

(10) Patent No.: US 9,601,375 B2
(45) Date of Patent: Mar. 21, 2017

(54) UV-CURE PRE-TREATMENT OF CARRIER FILM FOR WAFER DICING USING HYBRID LASER SCRIBING AND PLASMA ETCH APPROACH

(71) Applicants: Wei-Sheng Lei, San Jose, CA (US); Brad Eaton, Menlo Park, CA (US); Jungrae Park, Santa Clara, CA (US); Ajay Kumar, Cupertino, CA (US); James S. Papanu, San Rafael, CA (US); Prabhat Kumar, Fremont, CA (US)

(72) Inventors: Wei-Sheng Lei, San Jose, CA (US); Brad Eaton, Menlo Park, CA (US); Jungrae Park, Santa Clara, CA (US); Ajay Kumar, Cupertino, CA (US); James S. Papanu, San Rafael, CA (US); Prabhat Kumar, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/697,391

(22) Filed: Apr. 27, 2015

(65) Prior Publication Data

US 2016/0315009 A1    Oct. 27, 2016

(51) Int. Cl.
*H01L 21/301* (2006.01)
*H01L 21/46* (2006.01)
(Continued)

(52) U.S. Cl.
CPC ............ *H01L 21/78* (2013.01); *H01L 21/268* (2013.01); *H01L 21/3065* (2013.01);
(Continued)

(58) Field of Classification Search
CPC .... H01L 21/78; H01L 21/3086; B23L 26/367; B23K 26/367
(Continued)

(56) References Cited

U.S. PATENT DOCUMENTS 4,049,944 A    9/1977 Garvin et al.
4,339,528 A    7/1982 Goldman
(Continued)

FOREIGN PATENT DOCUMENTS

JP    9216085    8/1997
JP    10321908    12/1998
(Continued)

OTHER PUBLICATIONS

Linder, V. et al., "Water-Soluble Sacrificial Layers for Surface Micromachining," www.small-journal.com, 2005, 1, No. 7, 7 pgs.
(Continued)

*Primary Examiner* — David S Blum
(74) *Attorney, Agent, or Firm* — Blakely Sokoloff Taylor Zafman LLP

(57) ABSTRACT

Methods of dicing semiconductor wafers, each wafer having a plurality of integrated circuits, are described. In an example, a method of dicing a semiconductor wafer having a plurality of integrated circuits on a front side of the semiconductor wafer includes adhering a back side the semiconductor wafer on the dicing tape of a substrate carrier. Subsequent to adhering the semiconductor wafer on a dicing tape, the dicing tape is treated with a UV-cure process. Subsequent to treating the dicing tape with the UV-cure process, a dicing mask is formed on the front side of the semiconductor wafer, the dicing mask covering and protecting the integrated circuits. The dicing mask is patterned with a laser scribing process to provide gaps in the dicing mask, the gaps exposing regions of the semiconductor wafer
(Continued)

between the integrated circuits. The semiconductor wafer is plasma etched through the gaps in the dicing mask layer to singulate the integrated circuits.

17 Claims, 8 Drawing Sheets

(51) Int. Cl.
| | |
|---|---|
| H01L 21/78 | (2006.01) |
| H01L 21/447 | (2006.01) |
| H01L 21/48 | (2006.01) |
| H01L 21/50 | (2006.01) |
| H01L 21/308 | (2006.01) |
| H01L 21/3065 | (2006.01) |
| H01L 21/268 | (2006.01) |
| H01L 21/67 | (2006.01) |
| H01L 21/683 | (2006.01) |

(52) U.S. Cl.
CPC .... *H01L 21/3086* (2013.01); *H01L 21/67069* (2013.01); *H01L 21/6836* (2013.01)

(58) Field of Classification Search
USPC .................................................. 438/462, 113
See application file for complete search history.

(56) References Cited

U.S. PATENT DOCUMENTS

| | | | |
|---|---|---|---|
| 4,684,437 A | 8/1987 | Donelon et al. |
| 5,336,638 A | 8/1994 | Suzuki et al. |
| 5,593,606 A | 1/1997 | Owen et al. |
| 5,691,794 A | 11/1997 | Hoshi et al. |
| 6,051,503 A | 4/2000 | Bhardwaj et al. |
| 6,057,180 A | 5/2000 | Sun et al. |
| 6,174,271 B1 | 1/2001 | Kosmowski |
| 6,300,593 B1 | 10/2001 | Powell |
| 6,306,731 B1 | 10/2001 | Igarashi et al. |
| 6,407,363 B2 | 6/2002 | Dunsky et al. |
| 6,426,275 B1 | 7/2002 | Arisa |
| 6,465,158 B1 | 10/2002 | Sekiya |
| 6,528,864 B1 | 3/2003 | Arai |
| 6,574,250 B2 | 6/2003 | Sun et al. |
| 6,582,983 B1 | 6/2003 | Runyon et al. |
| 6,593,542 B2 | 7/2003 | Baird et al. |
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,361,990 B2 | 4/2008 | Lu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,638 B2 | 3/2009 | Mancini et al. |
| 7,507,639 B2 | 3/2009 | Nakamura |
| 7,629,228 B2 | 12/2009 | Haji et al. |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,804,043 B2 | 9/2010 | Deshi |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 | 3/2011 | Arita et al. |
| 7,923,351 B2 | 4/2011 | Arita |
| 7,926,410 B2 | 4/2011 | Bair |
| 7,927,973 B2 | 4/2011 | Haji et al. |
| 8,912,078 B1 * | 12/2014 | Lei .......................... H01L 21/78 257/E21.001 |
| 8,969,177 B2 * | 3/2015 | Chowdhury ............ H01L 21/78 438/113 |
| 9,142,459 B1 * | 9/2015 | Kumar ................ H01L 21/0337 |
| 9,159,624 B1 * | 10/2015 | Lei .......................... H01L 21/78 |
| 2003/0162313 A1 | 8/2003 | Kim et al. |
| 2004/0080045 A1 | 4/2004 | Kimura et al. |
| 2004/0137700 A1 | 7/2004 | Sekiya |
| 2004/0157457 A1 | 8/2004 | Xu et al. |
| 2004/0212047 A1 | 10/2004 | Joshi et al. |
| 2006/0043535 A1 | 3/2006 | Hiatt |
| 2006/0086898 A1 | 4/2006 | Cheng et al. |
| 2006/0088984 A1 | 4/2006 | Li et al. |
| 2006/0146910 A1 | 7/2006 | Koochesfahani et al. |
| 2006/0205182 A1 | 9/2006 | Soejima |
| 2009/0255911 A1 | 10/2009 | Krishnaswami et al. |
| 2010/0013036 A1 | 1/2010 | Carey |
| 2010/0216313 A1 | 8/2010 | Iwai et al. |
| 2010/0248451 A1 | 9/2010 | Pirogovsky et al. |
| 2011/0014777 A1 | 1/2011 | Haji et al. |
| 2011/0312157 A1 | 12/2011 | Lei et al. |
| 2013/0045554 A1 | 2/2013 | Yamazaki |
| 2013/0065378 A1 | 3/2013 | Johnson et al. |
| 2013/0230972 A1 | 9/2013 | Johnson et al. |
| 2014/0106542 A1 | 4/2014 | Chowdhury et al. |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection," U.S. Appl. No. 61/491,693, filed May 3, 2011 24 pgs.

Prabhat, Kumar, et al., "Wafer Dicing Using Hybrid Laser Scribing and Plasma Etch Approach With Mask Application by Vacuum Lamination," U.S. Appl. No. 14/320,426, filed Jun. 30, 2014 47 pgs.

Lei, Wei-Sheng et al., "Vacuum Lamination of Polymeric Dry Films for Wafer Dicing Using Hybrid Laser Scribing and Plasma Etch Approach," U.S. Appl. No. 14/589,913, filed Jan. 5, 2015 58 pgs.

* cited by examiner

UV-CURE PRE-TREATMENT OF CARRIER FILM FOR WAFER DICING USING HYBRID LASER SCRIBING AND PLASMA ETCH APPROACH

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is implemented between the dice on the wafer to prevent damage to the integrated circuits, e.g., the chips and cracks are maintained at a distance from the actual integrated circuits. As a result of the spacing restrictions, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often is needed to separate the circuitry of each of the dice. Furthermore, after cutting, each die may need substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of dicing semiconductor wafers, each wafer having a plurality of integrated circuits thereon.

In an embodiment, a method of dicing a semiconductor wafer having a plurality of integrated circuits on a front side of the semiconductor wafer includes adhering a back side the semiconductor wafer on the dicing tape of a substrate carrier. Subsequent to adhering the semiconductor wafer on a dicing tape, the dicing tape is treated with a UV-cure process. Subsequent to treating the dicing tape with the UV-cure process, a dicing mask is formed on the front side of the semiconductor wafer, the dicing mask covering and protecting the integrated circuits. The dicing mask is patterned with a laser scribing process to provide gaps in the dicing mask, the gaps exposing regions of the semiconductor wafer between the integrated circuits. The semiconductor wafer is plasma etched through the gaps in the dicing mask layer to singulate the integrated circuits.

In another embodiment, a method of dicing a semiconductor wafer having a plurality of integrated circuits on a front side of the semiconductor wafer includes adhering a back side the semiconductor wafer on a dicing tape of a substrate carrier. Subsequent to adhering the semiconductor wafer on the dicing tape, a dicing mask is formed on the front side of the semiconductor wafer, the dicing mask covering and protecting the integrated circuits. Subsequent to forming the dicing mask, the dicing tape is treated with a UV-cure process. Subsequent to treating the dicing tape with the UV-cure process, the dicing mask is patterned with a laser scribing process to provide gaps in the dicing mask, the gaps exposing regions of the semiconductor wafer between the integrated circuits. The semiconductor wafer is plasma etched through the gaps in the dicing mask layer to singulate the integrated circuits.

In another embodiment, a system for dicing a semiconductor wafer having a plurality of integrated circuits includes a factory interface. A laser scribe apparatus is coupled with the factory interface. A cluster tool is coupled with the factory interface. The cluster tool includes a plasma etch chamber, a mask deposition chamber, and a UV-cure chamber.

DETAILED DESCRIPTION

Figure 1:
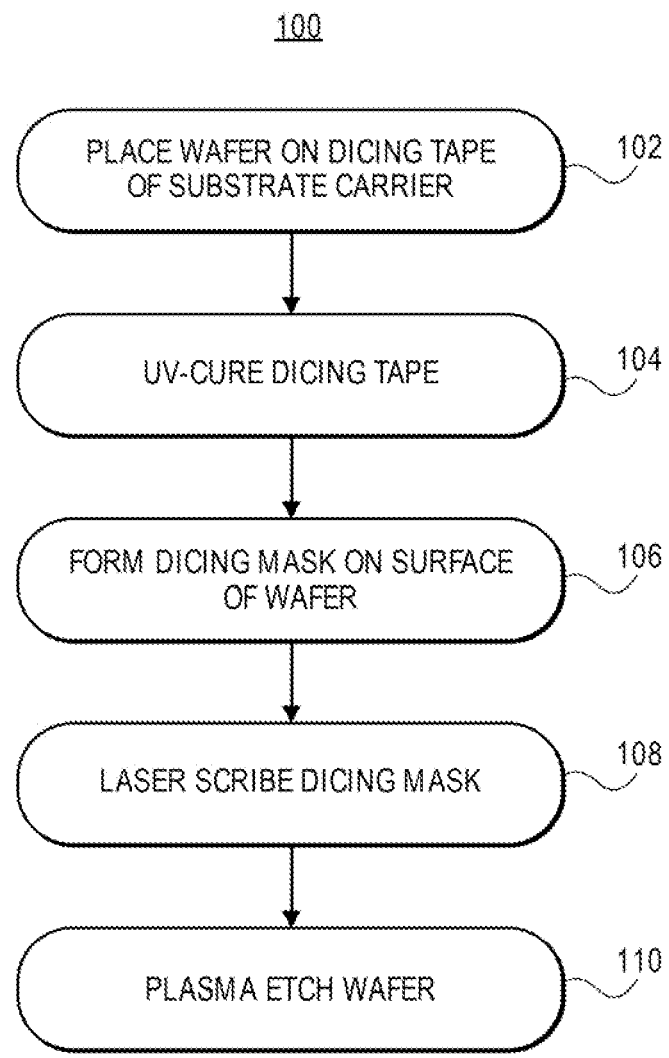
FIG. 1 is a flowchart representing various operations in a method of dicing a semiconductor wafer including a plurality of integrated circuits, in accordance with an embodiment of the present invention.

Methods of dicing semiconductor wafers, each wafer having a plurality of integrated circuits thereon, are described. In the following description, numerous specific details are set forth, such as UV-cure pre-treatments, laser scribing, and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. In an embodiment described herein, a UV-cure pre-treatment of a carrier film or dicing tape is implemented for wafer dicing using hybrid laser and plasma etch dicing approaches.

In accordance with one or more embodiments described herein, a hybrid laser scribing and plasma etching dicing process is implemented for wafer singulation with UV curing prior to mask formation, or at least prior to laser scribing and plasma etching. Embodiments may involve performing an ultra-violet (UV) curing operation before a wafer is diced. In the case of approaches involving spin coating for a mask formation process, the UV curing is performed prior to spin coating. Such a UV cure process as a pre-treatment can be implemented to permanently reduce dicing tape to wafer (die) adhesion forces, such that subsequent baking and/or etching processes do not worsen the adhesion force. For mask formation via a dry film vacuum lamination process, such a UV curing pre-treatment can be applied before or after the vacuum lamination process. However, in a specific embodiment, since vacuum lamination process typically involves some level of heating the dicing tape and wafer, preferably, UV curing is performed prior to vacuum lamination. In one or more embodiments, a UV curing pre-treatment process is optimized in such a way that there remains sufficient adhesion between dicing tape and wafer such that during spin coating, and post dicing cleaning operations, the wafer or singulated dies are not lifted off the dicing tape.

To provide context, conventionally, a UV curing process operation is typically conducted after wafer dicing. Some dicing tapes, such as UV curable or thermal release type tapes, are very thermally sensitive. Conventional baking processing and/or plasma etching processing can adversely affect/change the properties of the adhesive layer of a dicing tape by increasing the tape-to-die adhesion force permanently. The result is that after dicing, a performed UV curing operation may not sufficiently reduce die-to-tape adhesion forces which would otherwise be required to enable die pick for subsequent die assembly/packaging processes. Such a conventional process may involve, in order, spin coating to form a mask on a wafer, baking the spin-coated mask, laser scribing to pattern the wafer, plasma etching, wafer cleaning, and then application of a UV curing process.

By contrast, one or more embodiments described herein involve, in order, UV curing of a dicing tape of a substrate carrier having a wafer thereon, spin coating to form a mask on the wafer, baking, laser scribing to pattern wafer, plasma etching, wafer cleaning, and then die pick and place. Advantages of the approaches described herein may include one or more of, (1) since some dicing tapes, either UV curable or thermal release type tapes, are very thermally sensitive, approaches described herein may enable reduction of the adhesive forces of the dicing tape to singulated dies to enable die pick, (2) by applying a UV curing operation prior to die singulation (and in the case of spin-coated masks, prior to baking), adhesion forces between the wafer and dicing tape are reduced permanently such that subsequent baking and etching processing does not worsen (increase) the adhesion force, and/or (3) the UV curing process may be optimized allow for necessary adhesion between dicing tape and wafer such that during spin coating and post dicing cleaning operations, the wafer or dies are secured in place on the substrate carrier.

To provide broader context, conventional wafer dicing approaches include diamond saw cutting based on a purely mechanical separation, initial laser scribing and subsequent diamond saw dicing, or nanosecond or picosecond laser dicing. For thin wafer or substrate singulation, such as 50 microns thick bulk silicon singulation, the conventional approaches have yielded only poor process quality. Some of the challenges that may be faced when singulating die from thin wafers or substrates may include microcrack formation or delamination between different layers, chipping of inorganic dielectric layers, retention of strict kerf width control, or precise ablation depth control. Embodiments of the present invention include a hybrid laser scribing and plasma etching die singulation approach that may be useful for overcoming one or more of the above challenges.

In accordance with an embodiment of the present invention, a combination of laser scribing and plasma etching is used to dice a semiconductor wafer into individualized or singulated integrated circuits. In one embodiment, femtosecond-based laser scribing is used as an essentially, if not totally, non-thermal process. For example, the femtosecond-based laser scribing may be localized with no or negligible heat damage zone. In an embodiment, approaches herein are used to singulated integrated circuits having ultra-low k films. With convention dicing, saws may need to be slowed down to accommodate such low k films. Furthermore, semiconductor wafers are now often thinned prior to dicing. As such, in an embodiment, a combination of mask patterning and partial wafer scribing with a femtosecond-based laser, followed by a plasma etch process, is now practical. In one embodiment, direct writing with laser can eliminate need for a lithography patterning operation of a photo-resist layer and can be implemented with very little cost. In one embodiment, through-via type silicon etching is used to complete the dicing process in a plasma etching environment. Since both a laser scribe and a plasma etch process are crystal structure orientation independent, the crystal structure of the semiconductor wafer to be diced may be immaterial to achieving a vertical trench through the wafer.

Figure 3:
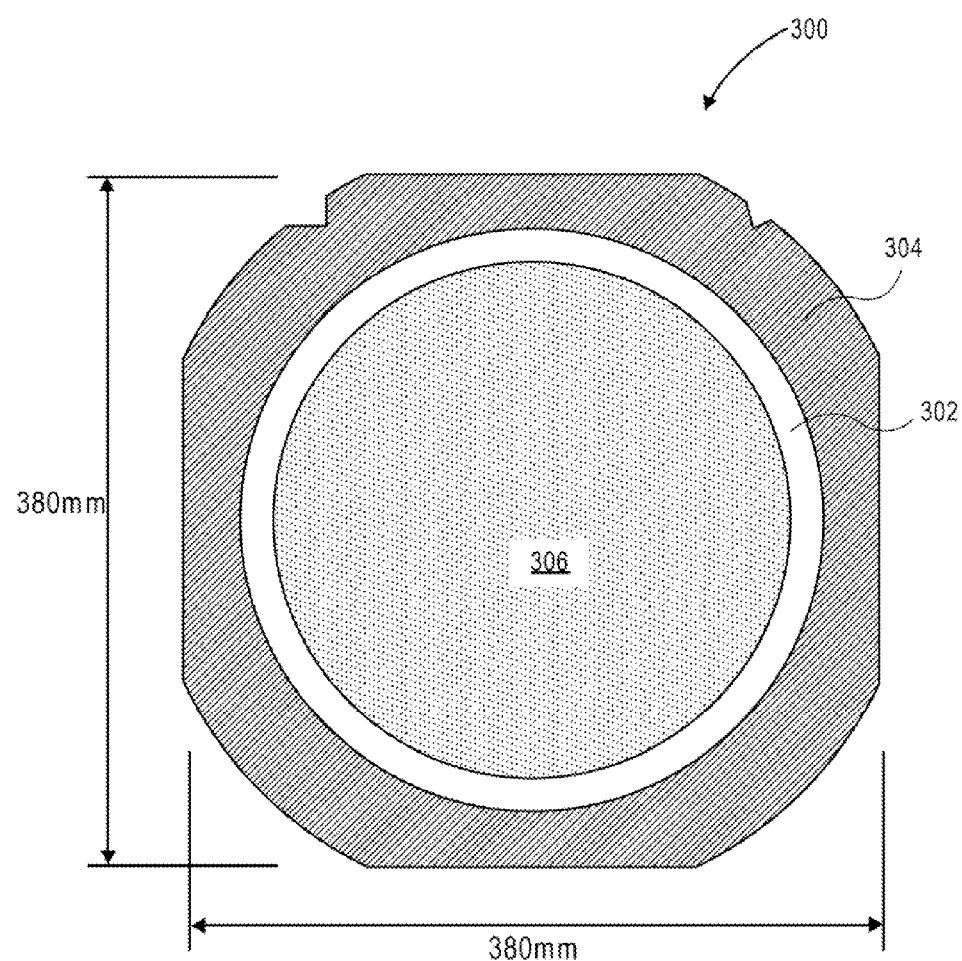
FIG. 3 illustrates a plan view representing an operations in a method of dicing a semiconductor wafer including a plurality of integrated circuits, in accordance with an embodiment of the present invention.
Figure 4A:
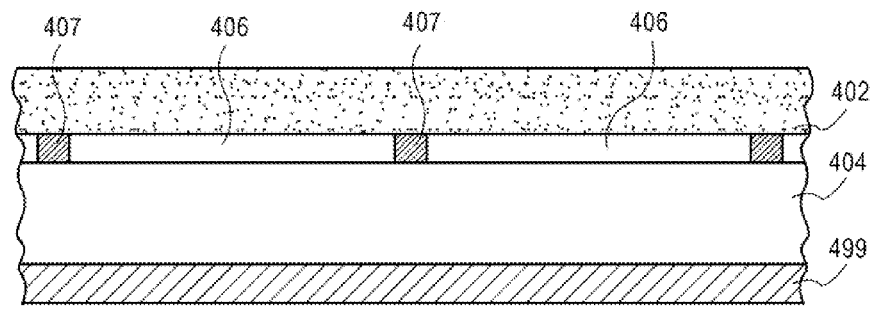
FIGS. 4A-4C illustrate cross-sectional views representing various operations in a method of dicing a semiconductor wafer including a plurality of integrated circuits, in accordance with an embodiment of the present invention.
Figure 4B:
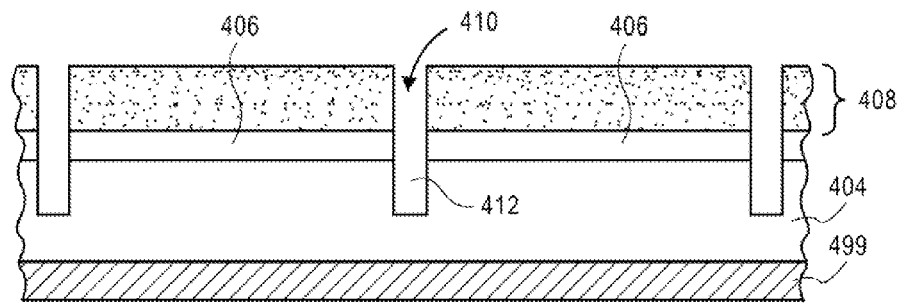
Figure 4C:
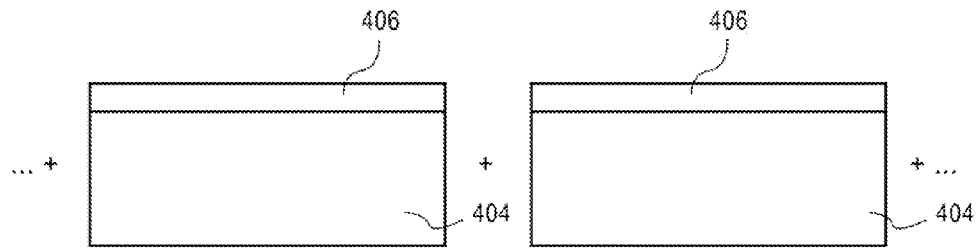

In a first aspect, a UV curing pre-treatment for a dicing process is performed prior to mask formation by spin coating. As an example, FIG. 1 is a flowchart 100 representing various operations in a method of dicing a semiconductor wafer including a plurality of integrated circuits, in accordance with an embodiment of the present invention. FIG. 3 illustrates a plan view and FIGS. 4A-4C illustrate cross-sectional views representing various operations in a method of dicing a semiconductor wafer including a plurality of integrated circuits, in accordance with an embodiment of the present invention.

Referring to operation 102 of flowchart 100, a wafer is placed on a dicing tape of a substrate carrier. FIG. 3 illustrates a plan view of a substrate carrier 300 suitable for supporting a wafer during a singulation process. Referring to FIG. 3, a substrate carrier 300 includes a layer of dicing tape 302 (also referred to as carrier tape) with an overlying or surrounding tape ring or frame 304. A wafer or substrate 306 is supported by the dicing tape 302 of the substrate carrier 300. In one embodiment, the wafer or substrate 306 is attached to the dicing tape 302 by an adhesive layer or die attach film as an uppermost layer of the dicing tape 302. In one embodiment, the tape ring or frame 304 is composed of stainless steel.

In an embodiment, a singulation process can be accommodated in a system sized to receive a substrate carrier such as the substrate carrier 300. In one such embodiment, a system such as system 600, described in greater detail below, can accommodate a wafer frame without impact on the system footprint that is otherwise sized to accommodate a substrate or wafer not supported by a substrate carrier. In one embodiment, such a processing system is sized to accommodate 300 millimeter-in-diameter wafers or substrates. The same system can accommodate a wafer carrier approximately 380 millimeters in width by 380 millimeters in length, as depicted in FIG. 3. However, it is to be appreciated that systems may be designed to handle 200 or 450 millimeter wafers or substrates or, more particularly, 200 or 450 millimeter wafer or substrate carriers.

In an embodiment, semiconductor wafer or substrate 306 is composed of a material suitable to withstand a fabrication process and upon which semiconductor processing layers may suitably be disposed. For example, in one embodiment, semiconductor wafer or substrate 306 is composed of a group IV-based material such as, but not limited to, crystalline silicon, germanium or silicon/germanium. In a specific embodiment, providing semiconductor wafer 306 includes providing a monocrystalline silicon substrate. In a particular embodiment, the monocrystalline silicon substrate is doped with impurity atoms. In another embodiment, semiconductor wafer or substrate 306 is composed of a III-V material such as, e.g., a III-V material substrate used in the fabrication of light emitting diodes (LEDs).

Referring to operation 104 of flowchart 100, UV-curing of the dicing tape 302 having the wafer or substrate 306 thereon is performed. The UV cure may be performed from the top side (wafer side) or from the bottom side of the dicing tape (from below the dicing tape). In one embodiment, the UV cure is performed to weaken an adhesion between the dicing tape and the semiconductor wafer. However, the weakening is performed as to only partially weaken the adhesion such that the wafer remains adhered to the dicing tape with sufficient adhesion to support the wafer through rigorous process operations such as mask formation and mask removal. In one embodiment, the weakening is permanent such that heating in subsequent process operations (e.g., mask formation or plasma etching) cannot re-strengthen the adhesion between the dicing tape and the wafer. In one embodiment, the UV exposure cross-links portions of an adhesive layer of the dicing tape to reduce adhesion strength to the wafer. In an embodiment, treating the dicing tape with the UV-cure process involves exposure to approximately 1-3 passes of a UV dose approximately in the range of 50 mJ to 300 mJ. In a specific embodiment, treating the dicing tape with the UV-cure process involves exposure to one pass of a UV dose of approximately 200 mJ.

In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

Referring to operation 106 of flowchart 100 and corresponding FIG. 4A, a dicing mask 402 is formed on the wafer or substrate of FIG. 3. It is to be appreciated that wafer or substrate 306 is represented by item 404 of FIGS. 4A-4C, and the dicing tape 302 is represented by item 499 in FIGS. 4A and 4B. In an embodiment, semiconductor wafer or substrate 404 has disposed thereon or therein, as a portion of the integrated circuits 406, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 406. Materials making up the streets 407 may be similar to or the same as those materials used to form the integrated circuits 406. For example, streets 407 may be composed of layers of dielectric materials, semiconductor materials, and metallization. In one embodiment, one or more of the streets 407 includes test devices similar to the actual devices of the integrated circuits 406.

In an embodiment, the dicing mask 402 is formed by a spin coating process. In a first such embodiment, the dicing mask 402 is a water-soluble mask layer. In an embodiment, the water-soluble mask layer is readily dissolvable in an aqueous media. For example, in one embodiment, the water-soluble mask layer is composed of a material that is soluble in one or more of an alkaline solution, an acidic solution, or in deionized water. In an embodiment, the water-soluble mask layer maintains its water solubility upon exposure to a heating process, such as heating approximately in the range of 50-160 degrees Celsius. For example, in one embodiment, the water-soluble mask layer is soluble in aqueous solutions following exposure to chamber conditions used in a laser and plasma etch singulation process. In one embodiment, the water-soluble mask layer is composed of a material such as, but not limited to, polyvinyl alcohol, polyacrylic acid, dextran, polymethacrylic acid, polyethylene imine, or polyethylene oxide. In a specific embodiment, the water-soluble mask layer has an etch rate in an aqueous solution approximately in the range of 1-15 microns per minute and, more particularly, approximately 1.3 microns per minute.

In a second such embodiment, the dicing mask 402 is a UV-curable mask layer. In an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

In an embodiment, following spin coating of the dicing mask 402, baking may be performed. Such a baking operation may be performed to, e.g., remove solvent used in the spin-coating process and to solidify dicing mask 402. In one such embodiment, such a baking operation would otherwise unwantedly strengthen adhesion of dicing tape 499 to substrate 402. However, in one embodiment, the first UV curing of operation 104 permanently weakens the adhesion between dicing tape 499 and substrate 402 such that any heating from the baking operation cannot substantially re-strengthen the adhesion between dicing tape 499 and substrate 402.

Referring to operation 108 of flowchart 100 and corresponding FIG. 4B, the dicing mask 402 is patterned with a laser scribing process to provide a patterned dicing mask 408 with gaps 410, exposing regions of the semiconductor wafer or substrate 404 between the integrated circuits 406. As such, the laser scribing process is used to remove the material of the streets 407 originally formed between the integrated circuits 406. In accordance with an embodiment of the present invention, patterning the dicing mask 402 with the laser scribing process includes forming trenches 412 partially into the regions of the semiconductor wafer 404 between the integrated circuits 406, as depicted in FIG. 4B.

In an embodiment, patterning the dicing mask 402 with the laser scribing process includes using a laser having a pulse width in the femtosecond range, i.e., a femtosecond-based laser scribing process is used. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the dicing mask 402, the streets 407 and, possibly, a portion of the semiconductor wafer or substrate 404.

In an embodiment, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Referring again to FIG. 4B, an intermediate post mask-opening cleaning operation may optionally performed following the laser scribing but prior to the plasma etching described below in association with FIG. 4C. In an embodiment, the post mask-opening cleaning operation is a plasma-based cleaning process. In a first example, as described below, the plasma-based cleaning process is reactive to the regions of the substrate 404 exposed by the gaps 410. In the case of a reactive plasma-based cleaning process, the cleaning process itself may form or extend trenches 412 in the substrate 404 since the reactive plasma-based cleaning operation is at least somewhat of an etchant for the substrate 404. In a second, different, example, as is also described below, the plasma-based cleaning process is non-reactive to the regions of the substrate 404 exposed by the gaps 410.

In an embodiment, in either case, heating during such plasma treatment would otherwise unwantedly strengthen adhesion of dicing tape 499 to substrate 402. However, in one embodiment, the first UV curing of operation 104 permanently weakens the adhesion between dicing tape 499 and substrate 402 such that any heating from the plasma treatment cannot substantially re-strengthen the adhesion between dicing tape 499 and substrate 402.

In accordance with a first embodiment, the plasma-based cleaning process is non-reactive to exposed regions of the substrate 404 in that the exposed regions are not or only negligible etched during the cleaning process. In one such embodiment, only non-reactive gas plasma cleaning is used. For example, Ar or another non-reactive gas (or the mix) is used to perform a highly-biased plasma treatment both for mask condensation and cleaning of scribed openings.

In accordance with a second embodiment, the plasma-based cleaning process is reactive to exposed regions of the substrate 404 in that the exposed regions are partially etched during the cleaning process. In one such embodiment, Ar or another non-reactive gas (or the mix) is combined with $SF_6$ for a highly-biased plasma treatment for cleaning of scribed openings. The plasma treatment using mixed gases Ar+$SF_6$ under high-bias power is performed for bombarding mask-opened regions to achieve cleaning of the mask-opened regions. In the reactive breakthrough process, both physical bombardment from Ar and $SF_6$ along with chemical etching due to $SF_6$ and F-ions contribute to cleaning of mask-opened regions.

Referring to operation 110 of flowchart 100 and corresponding FIG. 4C, the semiconductor wafer 404 is etched through the gaps 410 in the patterned dicing mask 408 to singulate the integrated circuits 406. In accordance with an embodiment of the present invention, etching the semiconductor wafer 404 includes etching the trenches 412 formed with the laser scribing process (and possibly extended with a reactive post-mask-opening clean operation) to ultimately etch entirely through semiconductor wafer 404, as depicted in FIG. 4C. In an embodiment, heating during such plasma processing would otherwise unwantedly strengthen adhesion of dicing tape 499 to substrate 402. However, in one embodiment, the first UV curing of operation 104 permanently weakens the adhesion between dicing tape 499 and substrate 402 such that any heating from the plasma treatment cannot substantially re-strengthen the adhesion between dicing tape 499 and substrate 402.

In an embodiment, etching the semiconductor wafer 404 includes using a plasma etching process. In one embodiment, a through-silicon via type etch process is used. For example, in a specific embodiment, the etch rate of the material of semiconductor wafer 404 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer 404 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate.

In another embodiment, the plasma etching operation described in association with FIG. 4C employs a conventional Bosch-type dep/etch/dep process to etch through the substrate 404. Generally, a Bosch-type process consists of three sub-operations: deposition, a directional bombardment etch, and isotropic chemical etch which is run through many iterations (cycles) until silicon is etched through. However, as a result of the Bosch process, the sidewall surface takes a scallop structure which may be rough. This is particularly the effect where the laser scribing process generates an open trench much rougher than that which a lithographically defined etch process achieves. Such a rough die edge leads to lower than expected die break strength. In addition, the deposition sub-operation in a Bosch process generates a Flourine-rich Teflon-type organic film to protect the already etched sidewall which is not removed from the sidewall as the etch front proceeds (generally such polymer is only removed periodically from the bottom of the anisotropically etched trench). Accordingly, following the anisotropic Bosch-type plasma etch operation, the integrated circuits are in singulated form. Subsequently, in an embodiment, an isotropic chemical wet or plasma etch is applied to smoothen the sidewall by gently etching a thin layer of substrate (e.g., silicon) off the side wall. In an embodiment, the isotropic portion of the etching is based on a plasma generated from a combination of $NF_3$ and $CF_4$ as the etchant for sidewall smoothening treatment. Also, a higher bias power such as 1000 W is used. In an embodiment, an advantage of using a plasma generated from a combination of $NF_3$ and $CF_4$ as an etchant for sidewall smoothening lies in the lower isotropic etch rate (~0.15 um/min) so the smoothening treatment is more controllable. The high bias power is applied to achieve relatively high directional etch rates to etch off the ridges or rims on the sidewall.

In an embodiment, referring again to FIG. 4C, the patterned dicing mask layer 408 is removed after the singulation process. For example, in the case of a water soluble dicing mask layer, an aqueous solution may be used to remove the patterned dicing mask layer 408. In the case of a UV-curable dicing mask layer, a UV curing operation may be used to remove the patterned dicing mask layer 408. It is to be appreciated that the UV pre-treatment cure should be performed such that sufficient adhesion between the dicing tape and wafer is retained for mask removal, but that the adhesion is sufficiently weak to enable removal of singulated dies during die pick.

In a second aspect, a dicing mask layer is dry film laminated onto a surface of a wafer subsequent to placing the wafer on a wafer carrier which been subjected to a UV-cure pre-treatment. As an example, FIGS. 5A-5I illustrate cross-sectional views representing various operations in another method of dicing a semiconductor wafer including a plurality of integrated circuits, in accordance with another embodiment of the present invention.

Figure 5A:
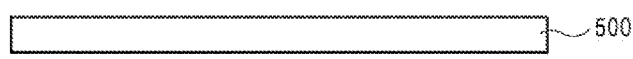
FIGS. 5A-5I illustrate cross-sectional views representing various operations in a method of dicing a semiconductor wafer including a plurality of integrated circuits, in accordance with an embodiment of the present invention.
Figure 5B:
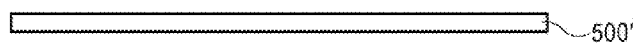
Figure 5C:
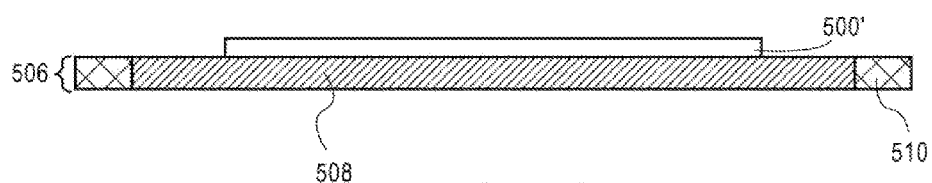

Referring to FIG. 5A, a wafer 500 is provided. A grind and polish of the backside of the wafer 500 may be used to provide a thinned wafer 500', as is depicted in FIG. 5B. Following the thinning process, a grinding tape, if present, may be removed. Referring to FIG. 5C, the wafer 500' is mounted on a substrate carrier 506. The substrate carrier 506 may include a dicing tape 508 supported and/or surrounded by a tape frame 510, as is depicted in FIG. 5C, and as was described in association with operation 102 of flowchart 100.

Figure 5D:
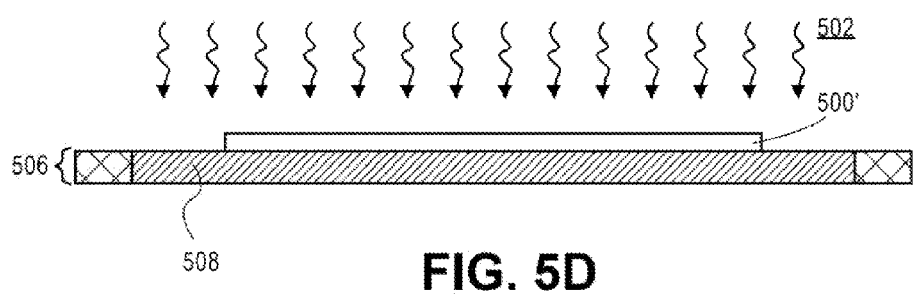
Figure 5E:
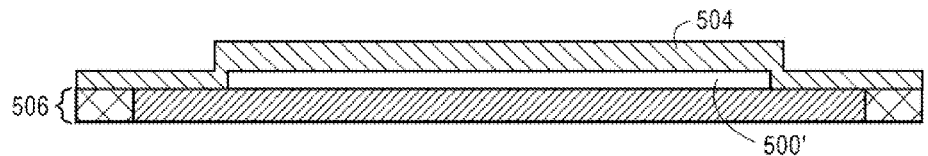

Referring to FIG. 5D, a UV-cure pre-treatment process 502 is performed, such as was described above in association with operation 104 of flowchart 100. Although depicted as being performed on the wafer side in FIG. 5D, it is to be appreciated that the UV cure process may instead be performed from below the dicing tape of the carrier, opposite the wafer side of the carrier. Referring to FIG. 5E, a polymeric dicing mask layer 504 is then dry film vacuum laminated onto the wafer 500' front side. It is to be appreciated that a portion of the polymeric dicing mask layer 504 may also be adhered to the carrier 512, as is depicted in FIG. 5E.

Figure 5F:
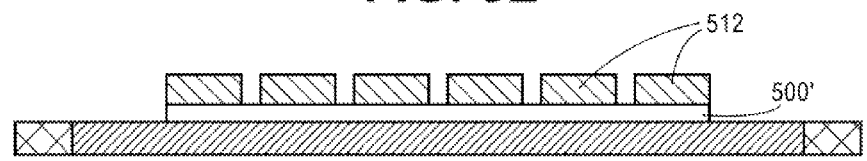
Figure 5G:
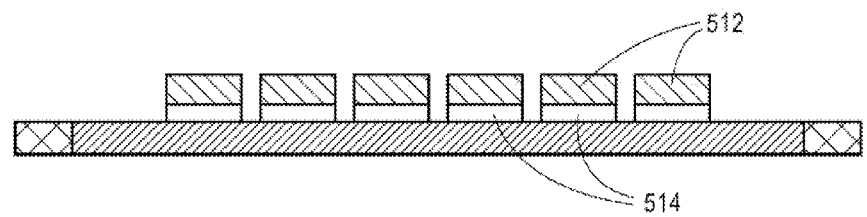
Figure 5H:
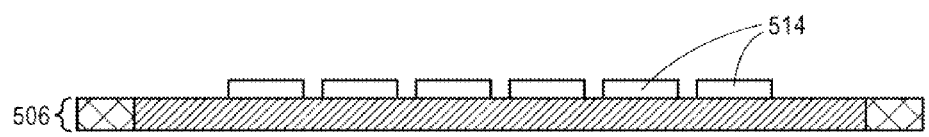
Figure 5I:
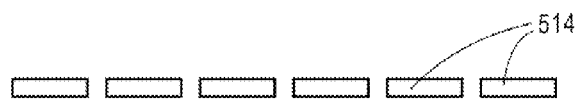

Referring to FIG. 5F, laser ablation of the polymeric dicing mask layer 504 is performed to form a patterned mask 512. A plasma etch operation is then performed to singulate individual dies 514, such as individual integrated circuits, as is depicted in FIG. 5G. Referring to FIG. 5H, the patterned mask 512 is removed from the individual dies 514. Individual dies 514 may then be removed from the substrate carrier 506 in a die pick procedure, as is depicted in FIG. 5I.

In an embodiment, the polymeric dicing mask layer 504 is applied onto the front side of the semiconductor wafer 500' by dry film vacuum lamination. The polymeric dicing mask layer 504 may be applied as a blanket layer or as a pre-patterned layer. In one embodiment, laminating the polymeric mask layer involves laminating a non-water-soluble polymeric mask layer. In one embodiment, the polymeric dicing mask layer 504 is or includes a material such as, but not limited to, a photoresist layer, a photopolymer solder mask layer, or a polyimide layer. In one embodiment, prior to laminating the polymeric dicing mask layer 504, the front side of the semiconductor wafer 500' is cleaned with a solvent- or aqueous-based cleaning solution to prepare an ultra-clean surface for effective dry film vacuum lamination.

In an embodiment, the dry film vacuum laminated polymer mask layer may have a thickness as thin as approximately 10 microns, but may be thicker (e.g., 10-20 microns) for applications requiring greater etching duration. Examples of suitable commercially available polymeric dry films in the thickness range of 10 to 20 microns, or even thicker include photoresists with Novolak resin, Etertec® negative dry film photoresists, and Dynamask® photopolymer solder mask dry films.

In an embodiment, the dry film vacuum lamination process of the polymeric film may be performed in a manner and in an environment designed and built to ensure complete elimination of air from the surfaces of wafer for die singulation. Thus, the process may be tuned to ensure a perfect or near-perfect adhesion of the dry film to the wafer or substrate without the formation of air bubbles. The lamination process involves the application of heat (e.g., as high as approximately 180° C.), high lamination pressure (e.g., approximately in the range of 1 to 5 Kg/cm$^2$), while applying vacuum suction between the laminating film (polymer mask) and the laminating surface (wafer).

In an embodiment, referring again to FIG. 5H, the patterned mask 512 is removed after the singulation process. For example, in the case of a non-water soluble polymeric mask layer, $O_2$ plasma etching (e.g., stripping) may be performed, which may be followed by water cleaning, if necessary, to remove the mask layer. In some cases, if sufficiently water-soluble, removal of the mask layer may be performed with water or other aqueous-based cleaning. In an embodiment, the dry film laminated polymer masking layer is a non-water-soluble polymeric mask layer, and removing the polymeric mask layer involves using an $O_2$-based plasma process. In another embodiment, the dry film laminated polymer masking layer is or includes a material such as, but not limited to, a photoresist layer, a photopolymer solder mask layer, or a polyimide layer, and removing the polymeric mask layer involves using an $O_2$-based plasma process.

Figure 2:
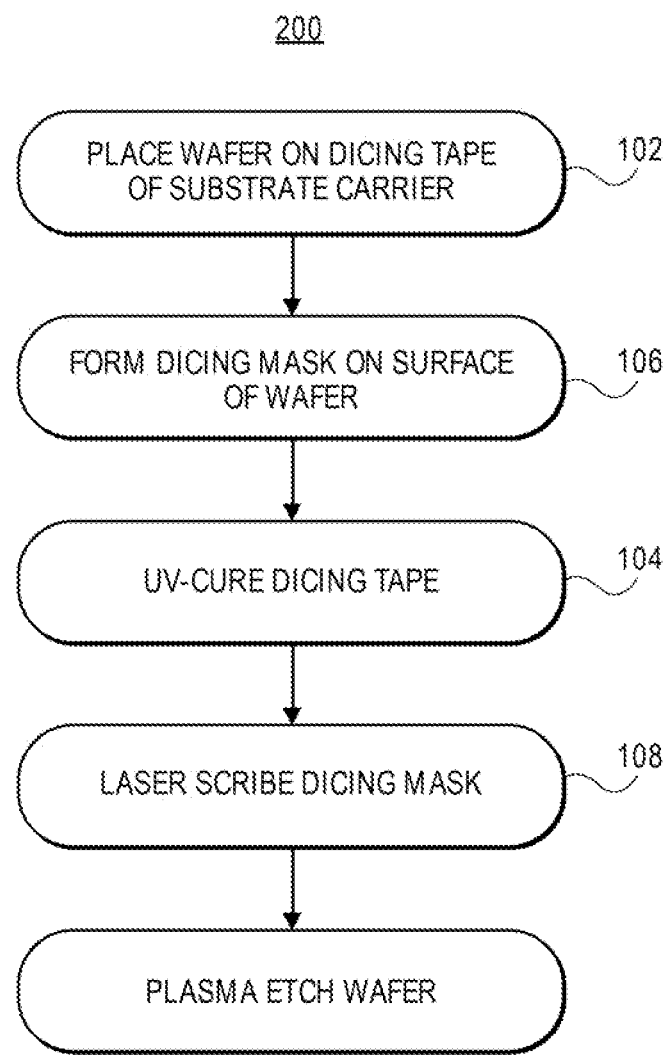
FIG. 2 is a flowchart representing various operations in another method of dicing a semiconductor wafer including a plurality of integrated circuits, in accordance with an embodiment of the present invention.

In another aspect, a UV cure pre-treatment may be performed after mask deposition. For example, FIG. 2 is a flowchart representing various operations in another method of dicing a semiconductor wafer including a plurality of integrated circuits, in accordance with an embodiment of the present invention. In FIG. 2, the operations 104 and 106 are reversed from flowchart 100. Such a reversal may be applied, e.g., if the mask forming operation does not involve excessive heating which would otherwise over-strengthen the adhesion between the dicing tape and wafer. For example a low temperature lamination process may be followed by the UV pre-treatment curing to ultimately provide a weakened adhesion between the dicing tape and wafer.

A single process tool may be configured to perform many or all of the operations in a hybrid laser ablation and plasma etch singulation process. For example, FIG. 6 illustrates a block diagram of a tool layout for laser and plasma dicing of wafers or substrates, in accordance with an embodiment of the present invention.

Figure 6:
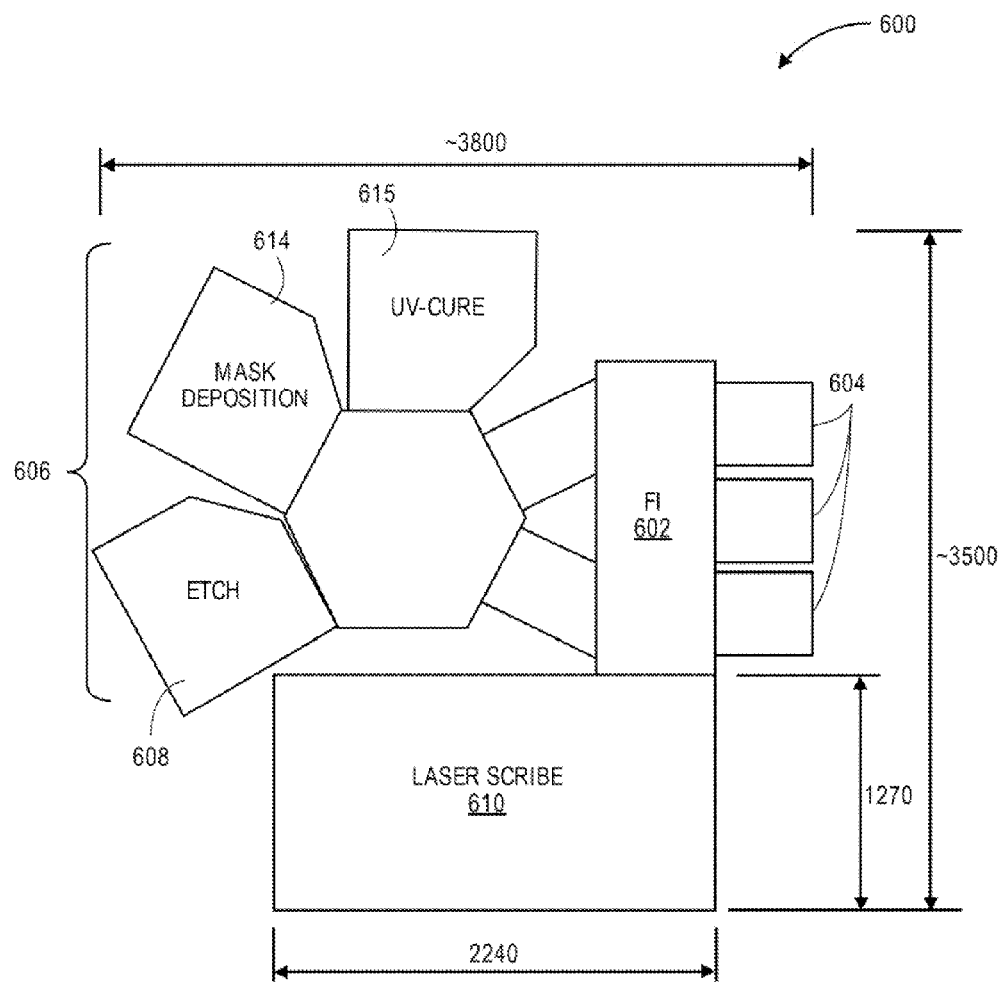
FIG. 6 illustrates a block diagram of a tool layout for laser and plasma dicing of wafers or substrates, in accordance with an embodiment of the present invention.

Referring to FIG. 6, a process tool 600 includes a factory interface 602 (FI) having a plurality of load locks 604 coupled therewith. A cluster tool 606 is coupled with the factory interface 602. The cluster tool 606 includes one or more plasma etch chambers, such as plasma etch chamber 608. A laser scribe apparatus 610 is also coupled to the factory interface 602. The overall footprint of the process tool 600 may be, in one embodiment, approximately 3500 millimeters (3.5 meters) by approximately 3800 millimeters (3.8 meters), as depicted in FIG. 6.

In an embodiment, the laser scribe apparatus 610 houses a femtosecond-based laser. The femtosecond-based laser is suitable for performing a laser ablation portion of a hybrid laser and etch singulation process, such as the laser abalation processes described above. In one embodiment, a moveable stage is also included in laser scribe apparatus 600, the moveable stage configured for moving a wafer or substrate (or a carrier thereof) relative to the femtosecond-based laser. In a specific embodiment, the femtosecond-based laser is also moveable. The overall footprint of the laser scribe apparatus 610 may be, in one embodiment, approximately 2240 millimeters by approximately 1270 millimeters, as depicted in FIG. 6.

In an embodiment, the one or more plasma etch chambers 608 are configured for etching a wafer or substrate through the gaps in a patterned mask to singulate a plurality of integrated circuits. In one such embodiment, the one or more plasma etch chambers 608 are configured to perform a deep silicon etch process. In a specific embodiment, the one or more plasma etch chambers 608 are Applied Centura® Silvia™ Etch systems, available from Applied Materials of Sunnyvale, Calif., USA. The etch chambers may be specifically designed for a deep silicon etch used to create singulate integrated circuits housed on or in single crystalline silicon substrates or wafers. In an embodiment, a high-density plasma source is included in the plasma etch chambers 608 to facilitate high silicon etch rates. In an embodiment, more than one etch chamber is included in the cluster tool 606 portion of process tool 600 to enable high manufacturing throughput of the singulation or dicing process.

The factory interface 602 may be a suitable atmospheric port to interface between an outside manufacturing facility with laser scribe apparatus 610 and cluster tool 606. The factory interface 602 may include robots with arms or blades for transferring wafers (or carriers thereof) from storage units (such as front opening unified pods) into either cluster tool 606 or laser scribe apparatus 610, or both. Cluster tool 606 may include other chambers suitable for performing functions in a method of singulation. For example, in one embodiment, in place of an additional etch chamber, a UV-cure chamber 615 is included. In one embodiment, a mask deposition chamber 614 is included. In a specific such embodiment, the mask deposition chamber 614 is configured for spin-coating an etch mask. In another specific such embodiment, the mask deposition chamber 614 is configured for dry film laminating an etch mask. Other chambers included may be, e.g., a wet/dry station. The wet/dry station may be suitable for cleaning residues and fragments, or for removing a mask subsequent to a laser scribe and plasma etch singulation process of a substrate or wafer. In an embodiment, a metrology station is also included as a component of process tool 600.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 600 described in association with FIG. 6. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
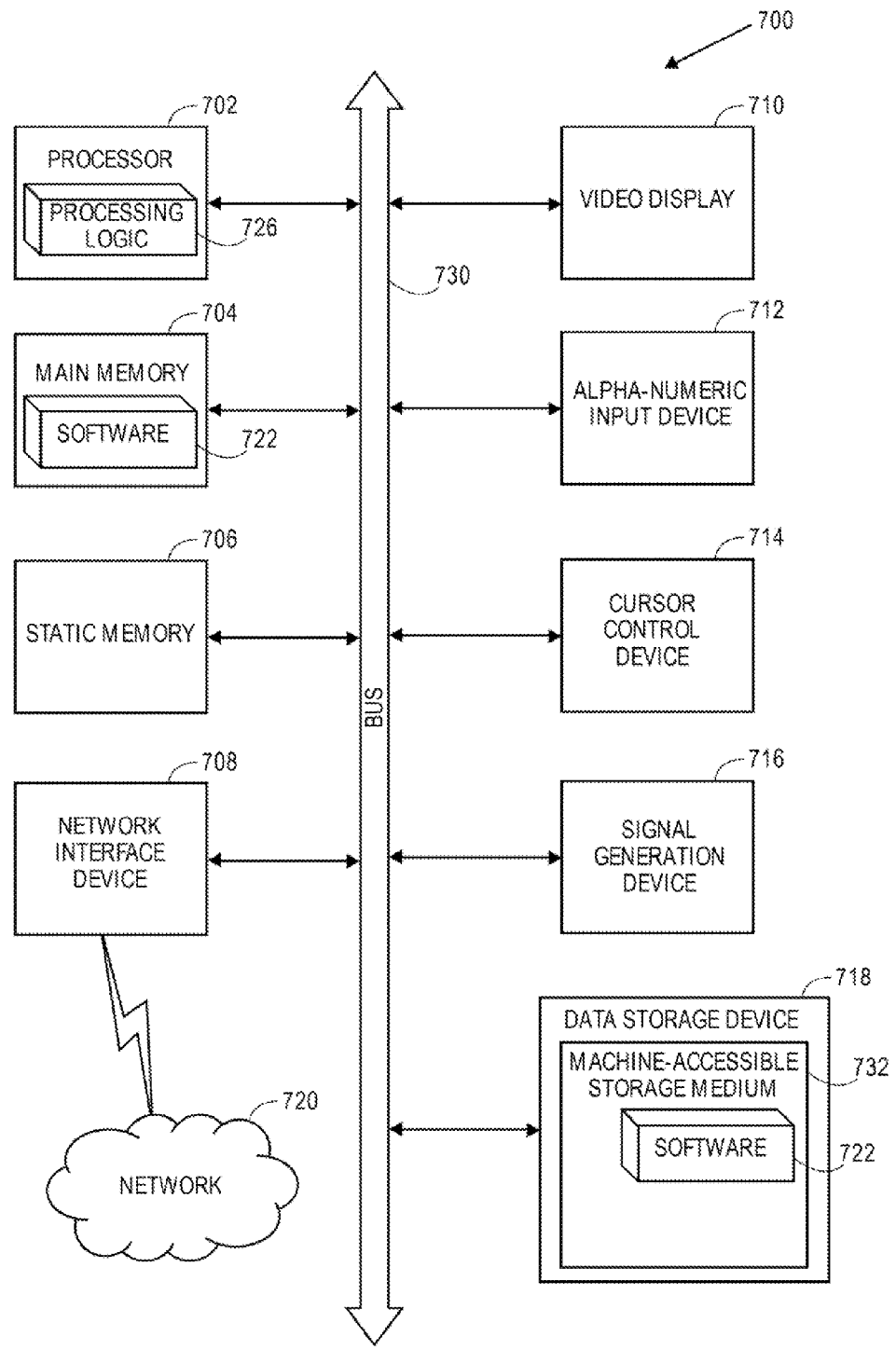
FIG. 7 illustrates a block diagram of an exemplary computer system, in accordance with an embodiment of the present invention.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of embodiments of the present invention. The term "machine-readable storage medium" shall accordingly be taken to include, but not be limited to, solid-state memories, and optical and magnetic media.

Thus, methods of dicing semiconductor wafers, each wafer having a plurality of integrated circuits, have been disclosed.

What is claimed is:

1. A method of dicing a semiconductor wafer comprising a plurality of integrated circuits on a front side of the semiconductor wafer, the method comprising:

adhering a back side the semiconductor wafer on the dicing tape of a substrate carrier;

subsequent to adhering the semiconductor wafer on a dicing tape, treating the dicing tape with a UV-cure process;

subsequent to treating the dicing tape with the UV-cure process, forming a dicing mask on the front side of the semiconductor wafer, the dicing mask covering and protecting the integrated circuits;

patterning the dicing mask with a laser scribing process to provide gaps in the dicing mask, the gaps exposing regions of the semiconductor wafer between the integrated circuits; and plasma etching the semiconductor wafer through the gaps in the dicing mask layer to singulate the integrated circuits.

2. The method of claim 1, wherein treating the dicing tape with the UV-cure process comprises exposure to approximately 1-3 passes of a UV dose approximately in the range of 50 mJ to 300 mJ.

3. The method of claim 1, wherein treating the dicing tape with the UV-cure process comprises permanently weakening an adhesion between the dicing tape of the substrate carrier and the back side of the semiconductor wafer.

4. The method of claim 1, wherein forming the dicing mask comprises spin-coating a masking layer on the front side of the semiconductor wafer.

5. The method of claim 4, further comprising:

subsequent to spin-coating the masking layer on the front side of the semiconductor wafer and prior to patterning the dicing mask with a laser scribing process, baking the masking layer.

6. The method of claim 4, wherein spin-coating the masking layer comprises forming a water-soluble mask layer.

7. The method of claim 4, wherein spin-coating the masking layer comprises forming a UV-curable mask layer.

8. The method of claim 1, wherein forming the dicing mask comprises laminating a polymeric mask layer onto the front side of the semiconductor wafer by dry film vacuum lamination.

9. The method of claim 8, wherein laminating the polymeric mask layer onto the front side of the semiconductor wafer by dry film vacuum lamination comprises heating the semiconductor wafer.

10. The method of claim 1, further comprising:

subsequent to plasma etching the semiconductor wafer through the gaps in the dicing mask layer, performing a die pick of the singulated integrated circuits from the dicing tape of the substrate carrier.

11. The method of claim 10, further comprising:

subsequent to plasma etching the semiconductor wafer through the gaps in the dicing mask layer and prior to performing the die pick, removing the dicing mask layer.

12. A method of dicing a semiconductor wafer comprising a plurality of integrated circuits on a front side of the semiconductor wafer, the method comprising:

adhering a back side the semiconductor wafer on a dicing tape of a substrate carrier;

subsequent to adhering the semiconductor wafer on the dicing tape, forming a dicing mask on the front side of the semiconductor wafer, the dicing mask covering and protecting the integrated circuits;

subsequent to forming the dicing mask, treating the dicing tape with a UV-cure process;

subsequent to treating the dicing tape with the UV-cure process, patterning the dicing mask with a laser scribing process to provide gaps in the dicing mask, the gaps exposing regions of the semiconductor wafer between the integrated circuits; and plasma etching the semiconductor wafer through the gaps in the dicing mask layer to singulate the integrated circuits.

13. The method of claim 12, wherein treating the dicing tape with the UV-cure process comprises exposure to approximately 1-3 passes of a UV dose approximately in the range of 50 mJ to 300 mJ.

14. The method of claim 12, wherein treating the dicing tape with the UV-cure process comprises permanently weakening an adhesion between the dicing tape of the substrate carrier and the back side of the semiconductor wafer.

15. The method of claim 12, wherein forming the dicing mask comprises laminating a polymeric mask layer onto the front side of the semiconductor wafer by dry film vacuum lamination.

16. The method of claim 12, further comprising:

subsequent to plasma etching the semiconductor wafer through the gaps in the dicing mask layer, performing a die pick of the singulated integrated circuits from the dicing tape of the substrate carrier.

17. The method of claim 16, further comprising:

subsequent to plasma etching the semiconductor wafer through the gaps in the dicing mask layer and prior to performing the die pick, removing the dicing mask layer.

\* \* \* \* \*